(12) United States Patent
Kishimoto et al.

(10) Patent No.: US 6,552,421 B2
(45) Date of Patent: Apr. 22, 2003

(54) SEMICONDUCTOR DEVICE AND A METHOD OF MANUFACTURING THE SAME

(75) Inventors: Munehisa Kishimoto, Kamakura (JP); Toshinori Hirashima, Takasaki (JP); Hiroshi Satou, Takasaki (JP); Hiroi Oka, Tamamura (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/867,655

(22) Filed: May 31, 2001

(65) Prior Publication Data

US 2001/0050422 A1 Dec. 13, 2001

(30) Foreign Application Priority Data

Jun. 9, 2000 (JP) ........................................ 2000-173885

(51) Int. Cl.⁷ .............................................. H01L 23/02
(52) U.S. Cl. ........................ 257/678; 257/777; 257/783
(58) Field of Search ................................ 257/678, 737, 257/734, 735, 777, 778, 779, 781, 782, 783, 787, 784

(56) References Cited

U.S. PATENT DOCUMENTS 4,933,030 A * 6/1990 Dietz ........................ 106/1.14
5,391,604 A * 2/1995 Dietz et al. .................. 524/403
6,175,152 B1 * 1/2001 Toyoda ........................ 257/690

* cited by examiner

Primary Examiner—David Nelms
Assistant Examiner—David Nhu
(74) Attorney, Agent, or Firm—Mattingly, Stanger & Malur, P.C.

(57) ABSTRACT

The present invention provides a semiconductor device which is stably operated even with respect to heat generated upon its operation and makes no use of an environmental harmful substance (lead). The semiconductor device includes a support plate for supporting a semiconductor chip and the semiconductor chip fixed onto the support plate with an adhesive interposed therebetween. The semiconductor chip is fixed to the support plate by a highly thermal conductive adhesive and a high junction strength adhesive provided so as to separate bonding areas from one another. The highly thermal conductive adhesive is provided in plural places within the whole fixing area. The highly thermal conductive adhesive is associated with a heated portion of the semiconductor chip. The high junction strength adhesive is provided so as to surround the highly thermal conductive adhesive. Both the adhesives do not contain lead corresponding to the environmental harmful substance.

17 Claims, 10 Drawing Sheets

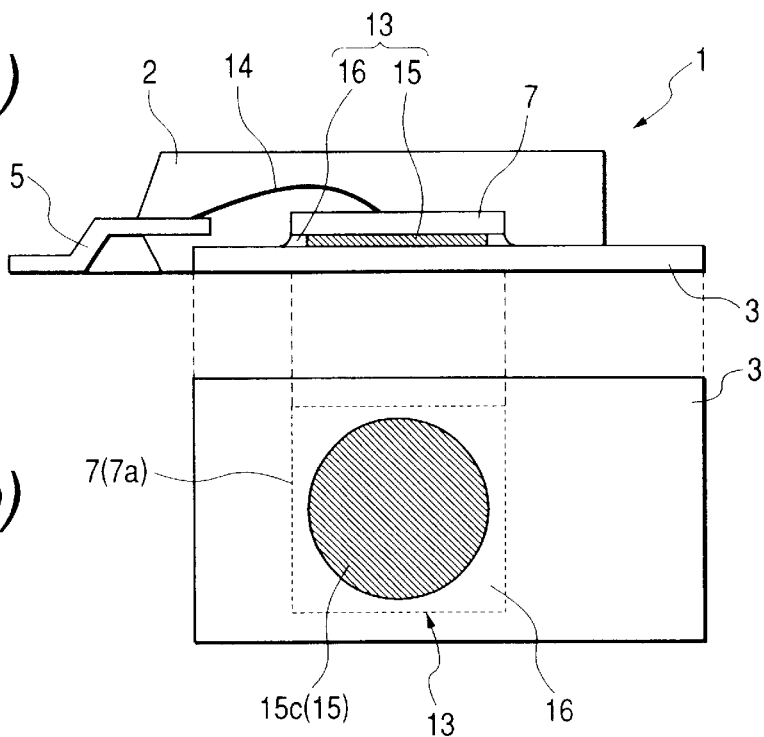
FIG. 10(a)
FIG. 10(b)
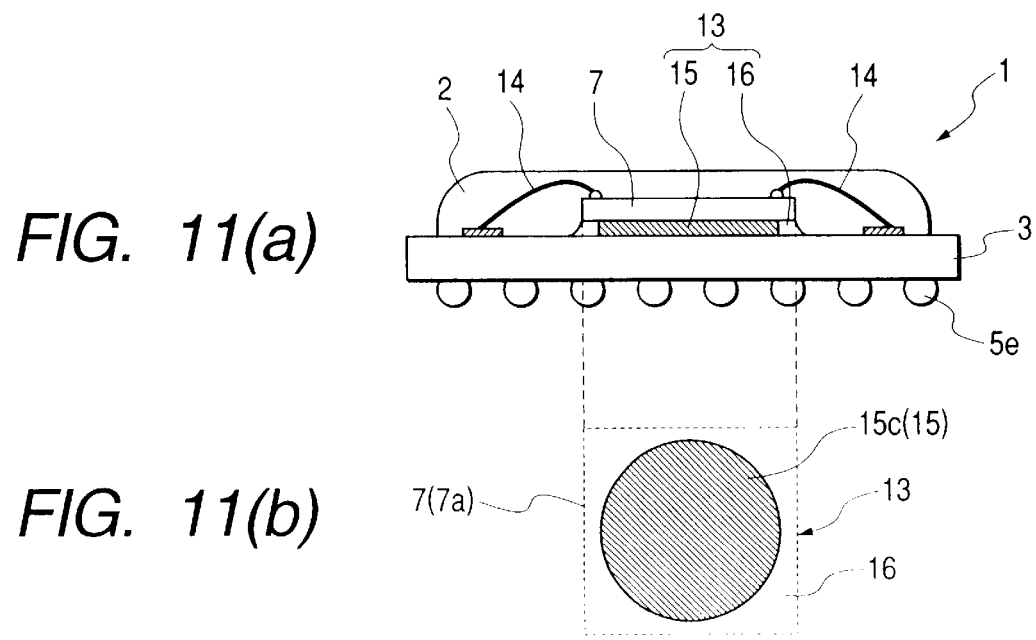
FIG. 11(a)
FIG. 11(b)

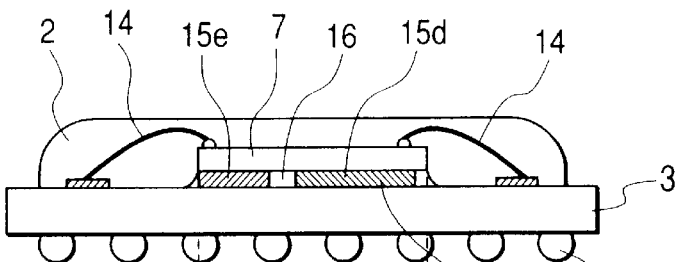
FIG. 12(a)
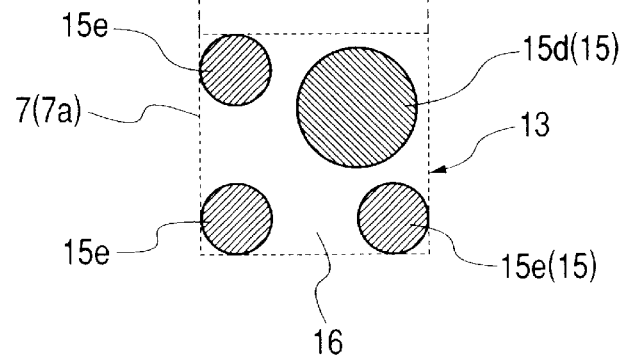
FIG. 12(b)
FIG. 13
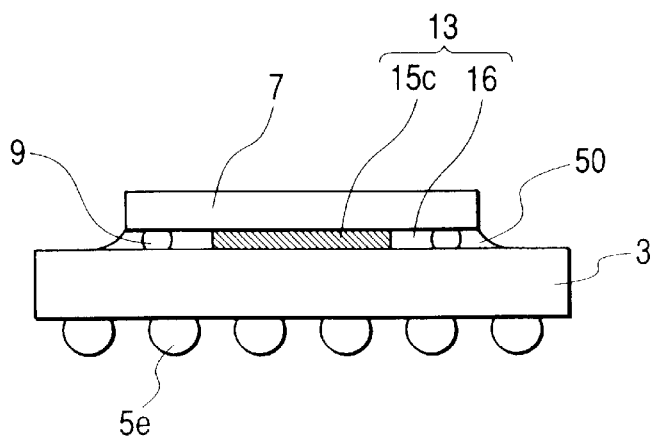

SEMICONDUCTOR DEVICE AND A METHOD OF MANUFACTURING THE SAME

BACKGROUND OF THE INVENTION

1. Field of the Invention

The present invention relates to a semiconductor device and a method of manufacturing it, and particularly to a technology for fixing a semiconductor chip large in the amount of heat generated thereby to a support plate without having to use lead. The present invention relates to, for example, a technology effective for application to the manufacture of a low voltage-driven power transistor brought into low electrical resistance, which is used for a power supply or the like for a portable device or the like, a low thermal-resistance power transistor used for a power supply or the like for a high output device such as a laser beam printer, a large-current power transistor used for automobile electrical equipment or the like, etc.

2. Description of the Related Art

As a power transistor built in a charger for a cellular telephone, a video camera, etc. and a power circuit for an office automation (OA) device or the like, there is known a low voltage-driven power transistor using low on-resistance. For example, the low voltage-driven power transistor has been described in the "Hitachi Databook: Hitachi Semiconductor Package" issued on September, 1997, P.329, which has been published by Semiconductor Business Department of Hitachi, Ltd.

On the other hand, solder, a conductive adhesive, a silver paste or the like has been used as a bonding material for fixing a semiconductor chip to a chip fixing portion such as a support substrate or the like. As the conductive adhesive, there is known an adhesive containing conductive noble metal particles, a synthetic resin and an organic solvent as disclosed in Japanese Patent Application Laid-Open No. Hei 11(1999)-66956.

Further, a high conductive silver paste disclosed in U.S. Pat. No. 5,391,604 (Feb. 21, 1995) is known as the silver paste. The high conductive silver paste has been described in the "Electronic Industry Material" published by Institute for Industrial Research, the July issue in 1997, P49–P54.

SUMMARY OF THE INVENTION

In a power device large in the amount of generated heat, solder containing lead has heretofore been used heavily as a bonding material for fixing a semiconductor chip to a mounting portion of a support plate. However, there has recently been a (leadless) move afoot to control the use of lead corresponding to a heavy metal from the viewpoint of the prevention of environmental destruction. However, the selection of a suitable material (adhesive) substitutable for lead-tin solder used for the conventional power transistors (package transistors called TO3P, TO220, etc.) remains a problem.

A structure of a power transistor will now be described in brief with reference to FIG. 16.

In a semiconductor device (power transistor) 1, a semiconductor chip 7 is fixed to its corresponding upper surface of a metal support plate 3 with a bonding material 13 interposed therebetween. The semiconductor chip 7 is fixed thereto so as to shift to the left of the support plate 3. The upper surface of the support plate 3 is covered with a sealing body or material (package) 2 in a state in which the right end of the support plate 3 is being exposed by a predetermined length. Thus, the lower surface (back) of the support plate 3 is exposed without being covered with the sealing material 2.

A plurality of leads 5 extending over the inside and outside of the sealing material 2 are provided at a left-end portion of the sealing material 2. These leads 5 constitute gate and source leads. Further, the support plate 3 serves as a drain.

The leads 5, which protrude from the end surface of the sealing material 2, are respectively bent downward in one stepwise form in the course thereof so as to take surface-mounted structures. Flat portions placed substantially in the same height as the tip support plate 3 serve as junctions. The leading ends of the leads 5 extending within the sealing body 2 and unillustrated electrodes of the semiconductor chip 7 are connected to one another by conductive wires 14.

Such a conductive adhesive and high conductive silver paste as described in the above references are considered as candidate materials each taken for an adhesive for fixing the semiconductor chip 7 to the support plate 3. It has been revealed that a problem arises in compatibility between high conductivity and reliability as a result of discussions about this point of view.

Namely, in a semiconductor device employed in various pieces of electronic equipment, a wide variety of functions have recently been formed within a semiconductor chip with advances in a system LSI, and the efficient outgoing radiation of heat generated within the semiconductor chip becomes an important subject for study. Upon chip bonding of the LSI, a silver paste has heretofore been used as a conductive adhesive containing no lead. This is an adhesive having conductivity even from either electrical or thermal viewpoint. Since the principal use of the conventional semiconductor device is intended for IC and LSI relatively low in power consumption, the electrical resistance of the conductive adhesive ranges from about 5 $\mu\Omega$cm to 1000 $\mu\Omega$cm and reaches a level increased by 100 times as compared with a metal junction.

FIG. 17 is a graph showing the general relationship between the content of a silver filler contained in a silver paste and resistivity thereof. In this silver paste, e.g., such a silver paste [hereinafter called a "conductive adhesive (1)"] as disclosed in Japanese Patent Application Laid-Open No. Sho 60(1985)-170658, which is brought into paste form by mixing and dispersing conductive powder and a liquid resin component, it is generally difficult to uniformly mix and disperse fillers with an increase in silver filler content, and a problem arises in terms of the implementation of resistivity equivalent to a metal. As indicated by the graph of FIG. 17, the conductive adhesive (1) has a silver filler content of about 85 Wt % even at the maximum.

In a silver paste [hereinafter called a "conductive adhesive (2)"] brought into paste form by mixing and dispersing a silver filler and a particulate resin component and using a volatile solvent as disclosed in U.S. Pat. No. 5,391,604, the silver filler and the resin particles are mixed and kept in a state floating in a medium in the case of the paste state. Therefore, a sliver filler content of 90% or more can easily be obtained as indicated by the graph of FIG. 17, and a significant reduction in electrical resistance value can be implemented as compared with the conductive adhesive (1).

Thus, such a silver paste that the silver filler content is brought to 85% or less as in the case of the conductive adhesive (1), is called a low conductive silver paste (whose heat conductivity is normally given as about 3 W/m·K) below. Such a silver paste that the silver filler content is high like 90% as in the case of the conductive adhesive (2), is also called a high conductive silver paste (whose heat conductivity is 60 W/m·K at maximum).

FIG. 18 is a characteristic diagram where the conductive adhesive (1) and the conductive adhesive (2) are respectively used as adhesives for chip bonding. Namely, the drawing shows a change in thermal resistance by a temperature cycle test at the time that a semiconductor chip with a power transistor built therein is mounted on a TO3P package. The same graph shows even one subjected to chip bonding with the conventional lead/tin solder for comparison.

According to such a result, it is understood that the conductive adhesive (2) greatly increases in thermal resistance with an increase in temperature cycle. This can be assumed to take place due to a reduction in resin component in the silver paste, an increase in small bubbles formed upon curing of the silver paste and degradation in bonding performance.

Further, the conductive adhesive (1) does not increase in thermal resistance upon the temperature cycle test. This means that the bonding strength of an adhesive for bonding a semiconductor chip to a support plate is high. Accordingly, the adhesive like the conductive adhesive (1) is called a high bonding or junction strength adhesive.

Thus, the high conductive silver paste [conductive adhesive (2)] is excellent in that the resistivity is low as compared with the low conductive paste (high junction strength adhesive) like the conductive adhesive (1). It is difficult to say that the high conductive silver paste is preferable to the low conductive silver paste in terms of an increase in thermal resistance in a temperature cycle test on a power product.

An allowable limit for the thermal resistance will not be demonstrated here because it differs for each product. However, it is a reality that the lower the thermal resistance and electrical resistance, the better. Characteristics commonly equivalent or close to the conventional lead/tin solder are required for power products large in the amount of generated heat, such as a subsequent power transistor, etc.

An object of the present invention is to provide a technology of fixing a semiconductor chip to a support plate by a highly thermal conductive adhesive and a high junction strength adhesive without having to use lead corresponding to an environmental harmful substance.

Another object of the present invention is to provide a semiconductor device stably operated even relative to the heat generated upon its operation, and a method of manufacturing it.

A further object of the present invention is to provide a technology of manufacturing a semiconductor device which makes no use of an environmental harmful substance.

The above, other objects and novel features of the present invention will become apparent from the description of the present specification and the accompanying drawings.

Summaries of typical ones of the inventions disclosed in the present application will be described in brief as follows:

(1) A semiconductor device wherein a semiconductor chip is fixed onto a support plate with an adhesive interposed therebetween, has a structure wherein highly thermal conductive adhesives each containing no lead corresponding to an environmental harmful substance, and a high junction strength adhesive are used so as to separate bonding areas from one another. Namely, there is provided a semiconductor device comprising a support plate which supports a semiconductor chip, and the semiconductor chip fixed onto the support plate with an adhesive interposed therebetween, and wherein the semiconductor chip is fixed to the support plate by a first adhesive and a second adhesive provided so as to separate bonding areas from one another, and the first adhesive is a highly thermal conductive adhesive higher in thermal conductivity than the second adhesive and the second adhesive is a high junction strength adhesive higher in junction strength than the first adhesive.

As a specific structure, there is provided a semiconductor device (TO220 type or the like) comprising a sealing body comprised of an insulative resin; a metal support plate which has at least part covered with the sealing body, and a lower surface exposed from the sealing body and which serves as a first electrode; a suspender lead which is continuously connected to the support plate and protrudes from one side of the sealing body; a second electrode lead which serves as a second electrode, and a control electrode lead which serves as a control electrode, both of which protrude from the one side of the sealing body side by side; and a semiconductor chip which is covered with the sealing body and has a first electrode at a lower surface thereof, and which has a second electrode and a control electrode at an upper surface thereof and whose lower surface is fixed to the support plate with a conductive adhesive interposed therebetween; and wires which are placed within the sealing body and respectively electrically connect the second electrode and the second electrode lead, and the control electrode and the control electrode lead. The semiconductor chip has a whole fixing area thereof fixed to the support plate by at least one highly thermal conductive adhesive and a high junction strength adhesive provided so as to separate bonding areas from one another. No space gap exists in an interface between the highly thermal conductive adhesive and the high junction strength adhesive. The highly thermal conductive adhesive is provided in plural places within the whole fixing area, and the partial highly thermal conductive adhesive is placed so as to correspond to a heated portion of the semiconductor chip. The highly thermal conductive adhesive and the high junction strength adhesive contain no lead. The semiconductor chip is provided with power MOSEETs with the first electrode, second electrode and control electrode respectively set as electrodes.

According to the means of (1) referred to above, (a) the heat generated from the semiconductor chip can be transferred to the support plate through the highly thermal conductive adhesive with high efficiency and hence heat-dissipated. Further, the semiconductor chip can firmly be fixed to the support plate by the high junction strength adhesive. As a result, stable heat radiation can be carried out without an increase in thermal resistance even in the case of a temperature cycle test. It is thus possible to improve a radiation characteristic and an electrical characteristic and achieve a stable operation of the semiconductor device.

(b) The semiconductor chip can firmly be fixed to the support plate without having to use an environmental harmful substance.

(c) Even in the case of the semiconductor device such as the TO220 type or the like, a malfunction caused by the heat generated from the semiconductor chip does not take place and hence a stable operation can be achieved.

BRIEF DESCRIPTION OF THE DRAWINGS

FIG. 10 is a typical view showing a semiconductor device according to another embodiment (embodiment 2) of the present invention;

FIG. 11 is a typical view illustrating a semiconductor device according to a further embodiment (embodiment 3) of the present invention;

FIG. 12 is a typical view depicting a semiconductor device according to a still further embodiment (embodiment 4) of the present invention;

FIG. 13 is a typical cross-sectional view showing a semiconductor device according to a still further embodiment (embodiment 5) of the present invention;

DESCRIPTION OF THE PREFERRED EMBODIMENTS

Figure 1:
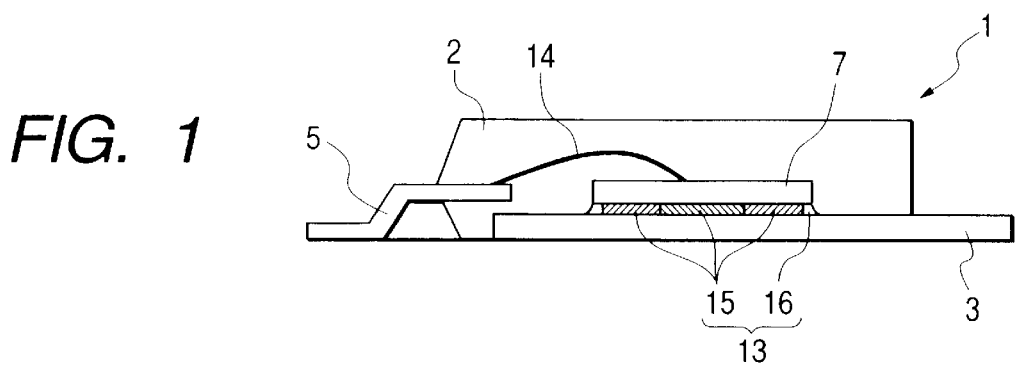
FIG. 1 is a typical cross-sectional view showing a semiconductor device according to one embodiment (embodiment 1) of the present invention.

Preferred embodiments of the present invention will hereinafter be described in detail with reference to the accompanying drawings. Incidentally, elements having the same functions in all the drawings for describing the embodiments of the present invention are respectively identified by the same reference numerals, and their repetitive description will therefore be omitted.

(Embodiment 1)

FIGS. 1 through 9 are respectively diagrams related to a semiconductor device according to one embodiment (embodiment 1) of the present invention.

The present embodiment 1 will be described by an example applied to the technology of manufacturing a semiconductor device (power transistor) in which a power MOSFET is built as a power transistor, for example. The semiconductor device is used as a low voltage-driven power transistor brought into low electrical resistance, which is used for a power supply or the like for a portable device or the like, a low thermal-resistance power transistor used for a power supply or the like for a high output device such as a laser beam printer, a large-current power transistor used for automobile electrical equipment or the like, etc.

Figure 2:
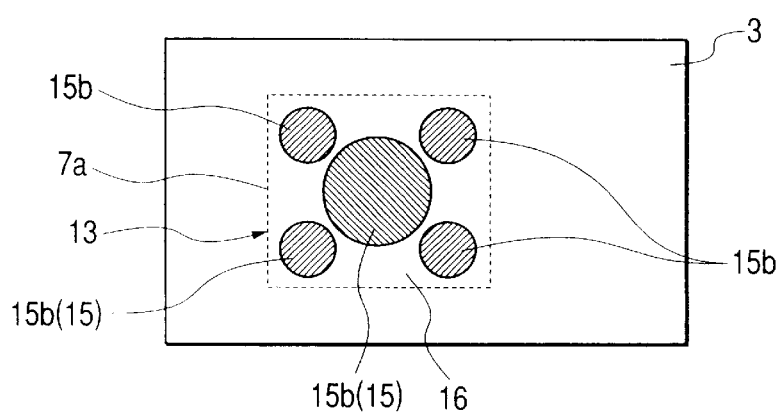
FIG. 2 is a typical view illustrating the layout of a fixing member for fixing a semiconductor chip employed in the semiconductor device according to the present embodiment 1 to a header.

FIGS. 1 and 2 are respectively diagrams for describing the outline of a power transistor, and FIGS. 3 through 9 are respectively diagrams related to the power transistor and its manufacture.

As shown in FIGS. 1 and 2, a semiconductor device (power transistor) 1 has a semiconductor chip 7 fixed to the surface (upper surface) of a metal support plate 3 with a jointing or bonding material 13 interposed therebetween. The semiconductor chip 7 is fixed thereto so as to shift to the left of the support plate 3. The upper surface of the support plate 3 is covered with a sealing body or material (package) 2 in a state in which the right end of the support plate 3 is being exposed by a predetermined length. Thus, the lower surface (back) of the support plate 3 is exposed without being covered with the sealing material 2.

A plurality of leads 5 extending over the inside and outside of the sealing material 2 are provided at a left-end portion of the sealing material 2. These leads 5 constitute gate and source leads. Further, the support plate 3 serves as a drain.

The leads 5, which protrude from the end surface of the sealing material 2, are respectively bent downward in one stepwise form in the course thereof to take surface-mounted structures. Flat portions placed substantially in the same height as the tip support plate 3 serve as junctions. The leading ends of the leads 5 extending within the sealing body 2 and unillustrated electrodes of the semiconductor chip 7 are connected to one another by conductive wires 14.

FIG. 2 is a typical plan view showing the layout of the bonding material 13 for fixing the semiconductor chip 7 to the support plate 3. In the present embodiment 1, the bonding material 13 comprises highly thermal conductive adhesives 15 and an adhesive 16 having a high bonding or junction strength. In the same drawing, a quadrangular portion indicated by a dotted line corresponds to the semiconductor chip 7 and is a portion corresponding approximately to a fixing area 7a formed by the bonding material 13. The highly thermal conductive adhesives 15 are distributedly laid out in plural places within the fixing area 7a, and the high junction strength adhesive 16 is placed in the other remaining area. In the drawing, a highly thermal conductive adhesive 15a is provided in the central portion of the fixing area 7a. Further, highly thermal conductive adhesives 15b are provided one by one inside the respective corners of the fixing area 7a, which are placed on the periphery thereof.

When the semiconductor chip 7 is fixed to the support plate 3, a dispenser is used to apply an adhesive to the surface of the support plate 3. Afterwards, the semiconductor chip 7 is positioned and superimposed on the liquid adhesive or applied liquid, and a predetermined load is applied to the semiconductor chip 7 to discharge air outside. The applied liquid, i.e., adhesive is baked and thereby cured, thus fixing the semiconductor chip 7 to the support plate 3.

In this case, the adhesive is actually applied to many positions such as nine positions or sixteen positions with a dispenser. The diameter of the applied liquid ranges from about 1 mm to about 2 mm at minimum, for example. Supplying the adhesive in a close state enables the adhesive to be applied to larger diameters.

While these may suitably be determined, the large-diameter adhesive is applied to the center of the semiconductor chip 7 and the smaller-diameter adhesives are respectively applied to four places on the periphery thereof as shown in FIG. 2 in the present embodiment 1, for example. Further, the high junction strength adhesive 16 is applied within the fixing area 7a except for the areas to apply the adhesives for five points (highly thermal conductive adhesives 15a and 15b) and is cured in this state to thereby obtain such a boning material 13 as shown in FIG. 1.

When the highly thermal conductive adhesives 15 and the high junction strength adhesive 16 are applied through the use of the dispenser, the bonding material is formed in such a manner that air gaps, i.e., air-contained portions are not developed at an interface surface between both adhesives.

Such an adhesive [conductive adhesive (2)] as disclosed in U.S. Pat. No. 5,391,604, for example, is used as each of the highly thermal conductive adhesives 15, whereas as the high junction strength adhesive 16, such an adhesive [conductive adhesive (1)] as disclosed in Japanese Patent Application Laid-Open No. Sho 60(1985)-170658 is used.

Owing to such a structure that the bonding areas are set in parts by the highly thermal conductive adhesives 15 and the high junction strength adhesive 16 in this way to fix the semiconductor chip 7 to the support plate 3, the heat generated by the semiconductor chip 7 is rapidly transferred to the support plate 3 by the highly thermal conductive adhesives 15 and promptly radiated from the support plate 3. Further, the semiconductor chip 7 is firmer fixed to the support plate 3 by the high junction strength adhesive 16.

Incidentally, the dissipation of heat through the high junction strength adhesive 16 is also carried out. Further, the fixing strength of the semiconductor chip 7 can be enhanced even by the highly thermal conductive adhesives 15.

Since the heat-dissipation property and the electrical characteristic, and the fixing strength of the semiconductor chip 7 can be enhanced without having to use lead/tin solder from these point of views, the stable operation of the semiconductor device 1 can be achieved.

Since the highly thermal conductive adhesives 15 are distributed over plural places as described in the present embodiment 1, the following advantages are brought about.

Upon mounting the semiconductor device 1 on a printed circuit board (a wiring board such as a motherboard), it is normally heated and processed in a reflow furnace. However, the effect of allowing a reduction in the occurrence of a so-called reflow crack developed at this time is obtained.

Namely, even when the highly thermal conductive adhesives 15 are not materials sufficiently low in hygroscopic property, the high junction strength adhesive 16 is supplied between the dispersed highly thermal conductive adhesives 15a and the highly thermal conductive adhesives 15b to provide reinforcement therebetween. Therefore, even if heating stress is produced in the reflow furnace, no peeling is developed over a wide range at an interface surface between each highly thermal conductive adhesive 15 and the support plate 3, and a structure hard to produce the reflow crack can be provided.

The manufacture of the semiconductor device 1, i.e., a TO220-type power transistor 1 will next be described more specifically with reference to FIGS. 3 through 9.

Figure 3:
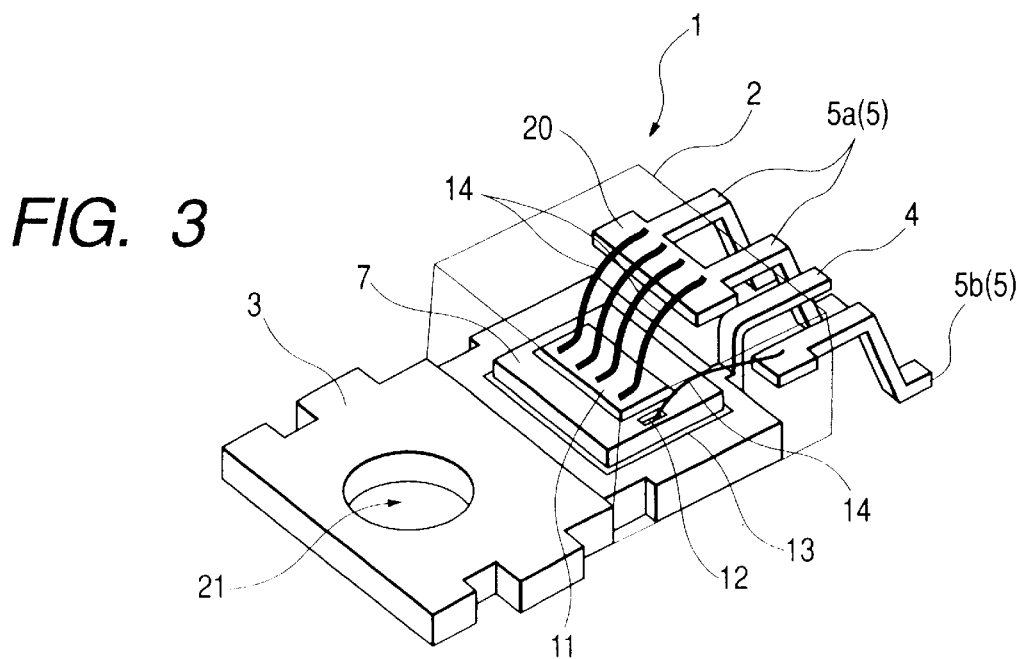
FIG. 3 is a typical perspective view depicting the semiconductor device according to the present embodiment
Figure 4:
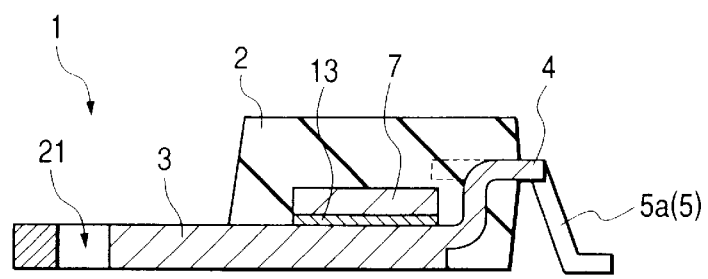
FIG. 4 is a cross-sectional view showing the semiconductor device according to the present embodiment.

As shown in FIGS. 3 and 4, the power transistor 1 according to the present embodiment 1 includes a sealing body or material 2 comprised of an insulative resin, a metal support plate 3 whose at least part is covered with the sealing material 2 and whose lower surface is exposed from the sealing material 2 and serves as a first electrode, a suspender lead 4, which is continuously connected to the support plate 3, protrudes from one side of the sealing material 2 and is bent in one stepwise form in the course thereof, and a plurality of leads 5 which protrude side by side from the one side of the sealing material 2. The leads 5 constitute second electrode leads (source lead) 5a and a control electrode lead (gate lead) 5b. Namely, the second electrode leads (source leads) 5a are formed as two and the control electrode lead (gate lead) 5b is formed as single. The whole support plate 3 is used as a drain's external terminal. The support plate 3 is also called a header.

On the other hand, a semiconductor chip 7 is fixed to the upper surface of the support plate 3 with a bonding material 13 interposed therebetween. The semiconductor chip 7 is covered with the sealing material 2. In FIGS. 3 and 4, a highly thermal conductive adhesive and a high junction strength adhesive are simply shown as the bonding material 13 without their partitioning. As shown in FIGS. 1 and 2, the bonding material 13 comprises highly thermal conductive adhesives 15 and a high junction strength adhesive 16. Such an adhesive as disclosed in U.S. Pat. No. 5,391,604, for example, is used as each of the highly thermal conductive adhesives 15, whereas as the high junction strength adhesive 16, such an adhesive as disclosed in Japanese Patent Application Laid-Open No. Sho 60 (1985)-170658 is used.

Figure 5:
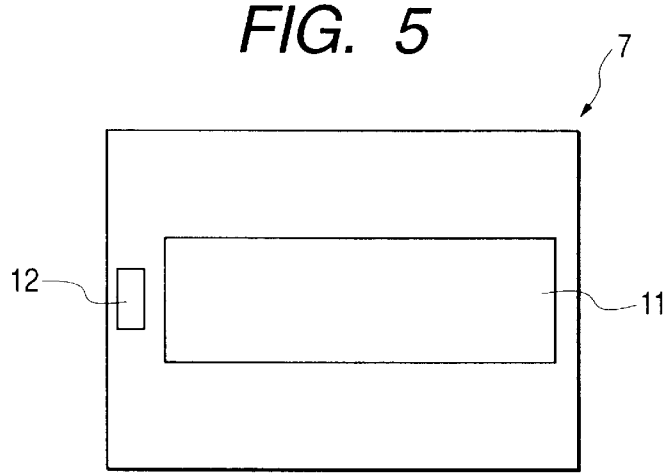
FIG. 5 is a typical plan view illustrating the semiconductor chip built in the semiconductor device.
Figure 6:
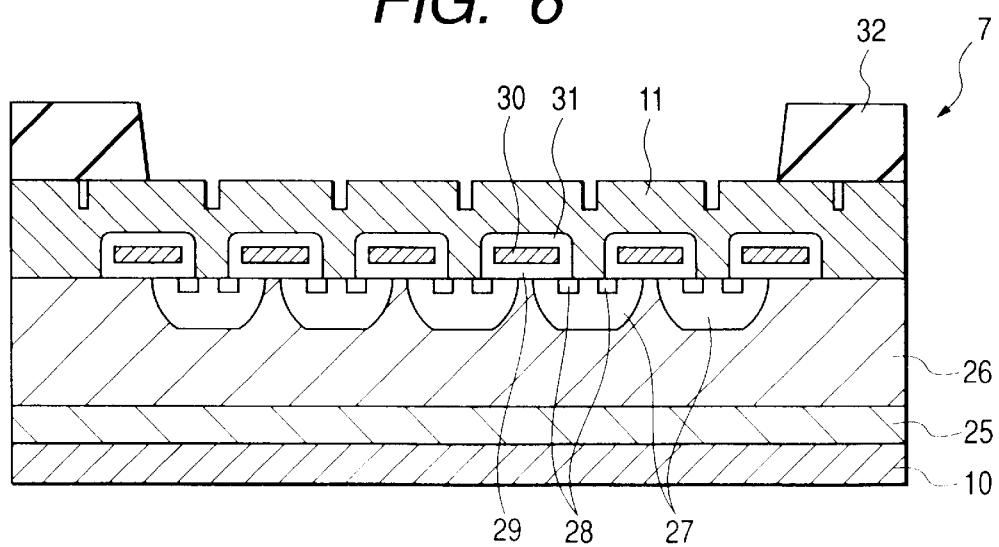
FIG. 6 is a typical cross-sectional view depicting the semiconductor chip.

For example, a power MOSFET is formed in the semiconductor chip 7 and has a structure wherein as shown in FIGS. 5 and 6, a first electrode (drain electrode) 10 is provided on the lower surface thereof and a second electrode (source electrode) 11 and a control electrode (gate electrode) 12 are provided on the upper surface thereof.

In the semiconductor chip 7, the drain electrode 10 provided on the lower surface thereof is fixed to the support plate (header) 3 with the conductive bonding material 13 interposed therebetween. Thus, the header 3 serves as a drain external electrode terminal. The leading ends of the second electrode leads (source leads) 5a extending within the sealing material 2 and the leading end of the control electrode lead (gate lead) 5b extending therewithin are respectively connected to a source electrode 11 and a gate electrode 12 of the semiconductor chip 7 through wires 14.

The suspender lead 4 is cut off in the neighborhood of the sealing material 2 and is held in a state unused for mounting. The source leads 5a and the gate lead 5b are respectively shaped in gull-wing types and take surface-mounted structures. Namely, the lower surfaces of the tip mounted portions of the gull-wing type leads, and the lower surface of the header 3 are flush with one another.

The suspender lead 4 and the gate lead 5b are respectively single but the source leads 5a are formed as two. The two source leads 5a extends side by side and are provided so as to continuously connect to the side face on the same side, of one connecting portion 20 within the sealing material 2. The connecting portion 20 and the second electrode (source electrode) 11 of the semiconductor chip 7 are respectively connected to each other by four wires 14.

The four wires 14 respectively correspond to an Al wire whose diameter is 500 $\mu$m and their connecting lengths (wire lengths) fall within 6.0 $\mu$mm. A wire 14 connected to the gate lead 5b is an Al wire whose diameter is about 100 $\mu$m.

A mounting hole 21 used upon attachment to a printed circuit board is provided in the central portion of the header 3 away from the sealing material 2.

A description will now be made of examples illustrative of dimensions of the respective portions. The header 3 has a maximum portion whose width, length and thickness are respectively 10.4 mm, 12.66 mm and 1.26 mm. The three leads 5 corresponding to the source leads 5a and the gate lead 5b respectively have a pitch of 3.4 mm. The suspender lead 4 is placed between the gate lead 5b and the source lead 5a adjacent thereto. The width of each lead 5 is 0.9 mm and the thickness thereof is 0.6 mm. The interval between the adjacent leads or the like for forming electrodes different from one another is set so as to be greater than or equal to 0.45 mm to prevent a short-circuit.

The length of the connecting portion 20 is 5.4 mm and the width thereof is 1.35 mm. Further, the distance between the lower surface of the header 3 and the lower surface of each lead is 2.59 mm. The sealing material 2 has a width which is a size coincident with the maximum width of the header 3, and a thickness of about 5.5 mm.

As shown in FIGS. 5 and 6, the semiconductor chip 7 comprises a thin rectangular plate structure whose length, width and thickness are respectively about 5.0 mm, 4.3 mm and 270 µm, for example. The size of the gate electrode 12 is set so that one side of its rectangle is 0.3 mm and the other side thereof is 0.6 mm. The size of the source electrode 11 is set so that one side of its rectangle is 1.4 mm and the other side thereof is 4.2 mm.

As shown in FIG. 6, the power MOSFET formed in the semiconductor chip 7 is a vertical type MOSFET. It has a structure wherein a large number of cells comprised of MOSFETs are formed in a first conduction type epitaxial layer 26 provided on the surface of a semiconductor substrate 25 comprised of first conduction type silicon. A first electrode (drain electrode) 10 is provided on the lower surface of the semiconductor substrate 25. The drain electrode 10 is formed of, for example, titanium, nickel and gold and has a thickness of about 5.0 µm, for example.

The power MOSFET comprises a plurality of second conduction type wells 27 formed in a surface layer of the epitaxial layer 26 in a line, source regions 28 each comprised of a first conduction type, which are respectively formed in surface portions of the wells 27, gate insulators 29 provided so as to extend between the adjacent wells 27, gate electrodes 30 respectively formed on the gate insulators 29, interlayer dielectrics 31 for covering the gate electrodes 30, a selectively-provided source electrode 11 placed over the epitaxial layer 26 and the interlayer dielectric 31 and electrically connected to the source regions 28, protective films 32 which selectively cover the source electrode 11, the interlayer dielectrics 31, etc. and partly expose the source electrode 11 and the gate electrode 12 each set as a wire bonding area, etc.

Figure 7:
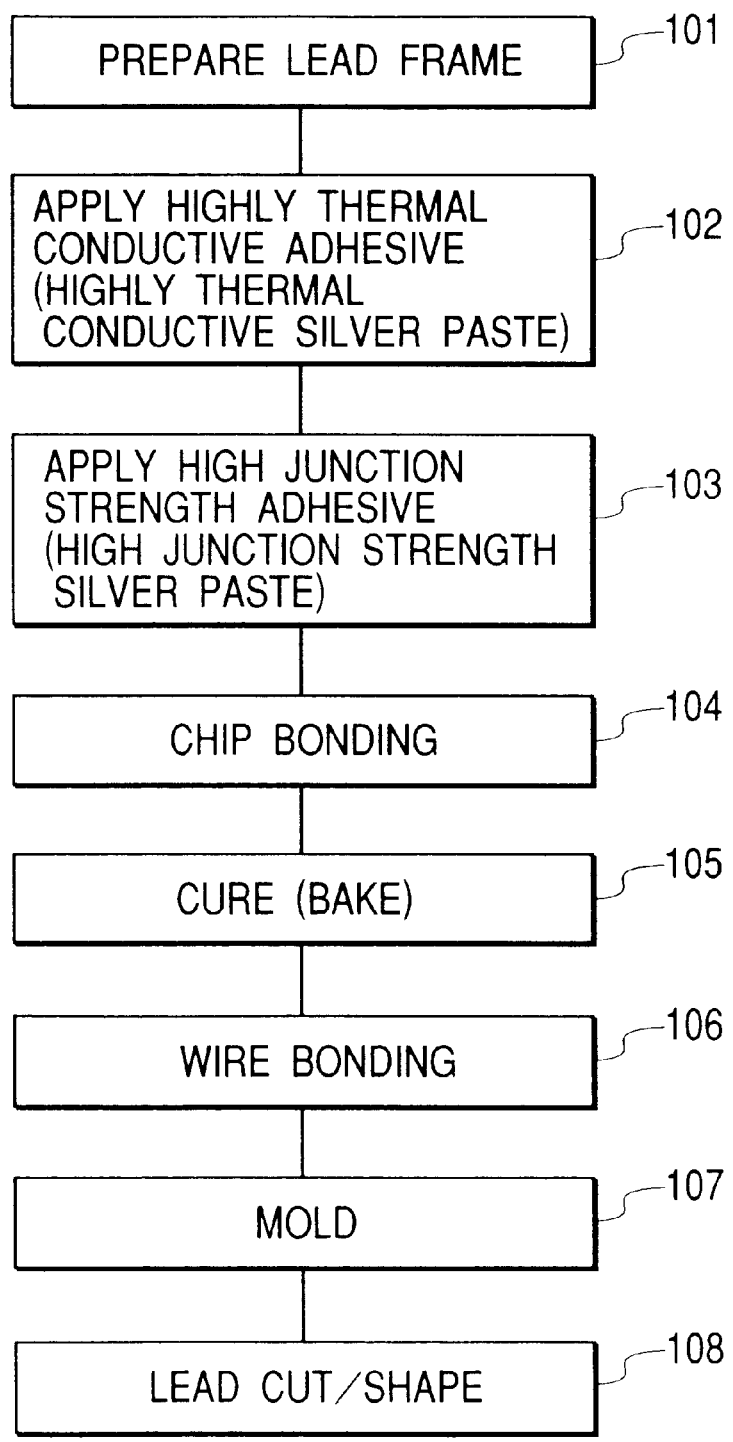
FIG. 7 is a flowchart showing a method of manufacturing the semiconductor device.

A method of manufacturing the semiconductor device according to the present embodiment 1 will next be described with reference to FIGS. 7 through 9. As indicated by a flowchart of FIG. 7, the power transistor 1 is manufactured through respective process steps for preparing a lead frame (Step 1), applying a highly thermal conductive adhesive (highly thermal conductive silver paste) (Step 102), applying a high junction strength adhesive (high junction strength silver paste) (Step 103), executing chip bonding (Step 104), executing curing (baking) (Step 105), executing wire bonding (Step 106), executing molding (Step 107), and executing lead cut/shape (Step 108).

Figure 8:
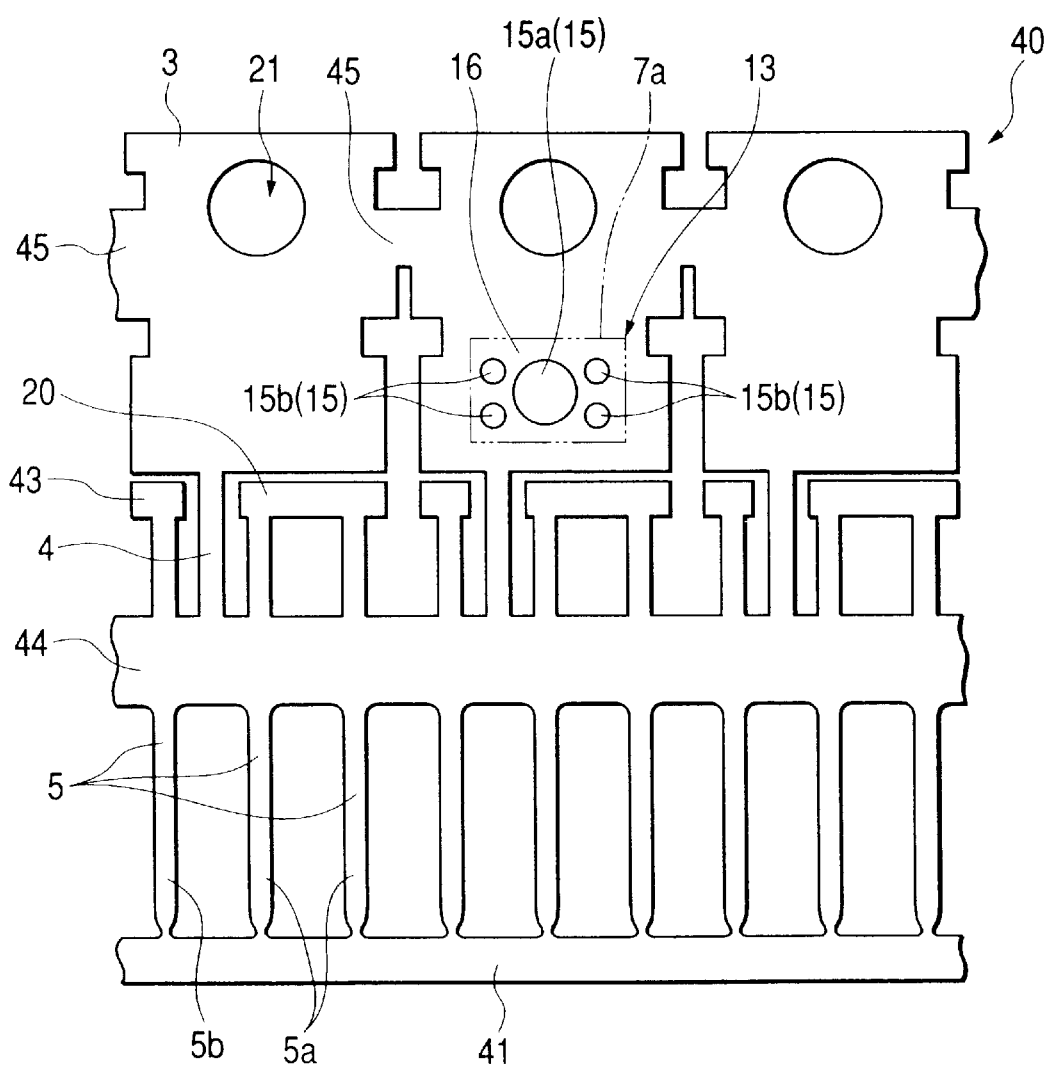
FIG. 8 is a plan view illustrating a lead frame used for the manufacture of the semiconductor device.

Namely, a lead frame 40 is prepared as shown in FIG. 8 upon manufacturing the power transistor 1 (step 101). As shown in FIG. 8, the lead frame 40 has a structure wherein a metal plate (profile) comprised of a band-shaped copper alloy or the like whose one side increases in thickness with a predetermined width, is punched out by a precision press to make patterning, and it is bent at its thin portion and the thin portion is elevated by one step as compared with its thick portion (step: 1.26 mm). The thick portion corresponds to the header 3 and has a thickness of 1.26 mm, and the thin portion corresponds to each of suspender leads 4, source leads 5a and gate leads 5b and is 0.6 mm in thickness.

The lead frame 40 becomes a strip body. A predetermined number (e.g., 10) of power transistors 1 can be manufactured by one lead frame 40. In FIG. 8, the number of power transistors is shown as three.

The lead frame 40 has a thin outer frame 41, and a plurality of cantilever-structured leads 5 which protrude in parallel at predetermined intervals from one side of the outer frame 41. The leads 5 intersect the outer frame 41. The pitch of each lead 5 is set to 3.4 mm.

The leads 5 are formed with three leads as one set. One of them on the left side constitutes the gate lead 5b a wide wire pad 43 is provided at the leading end thereof. The width of each lead 5 is 0.9 mm, and the width of the wire pad 43 is 2.0 mm and the length thereof is 1.36 mm.

The two leads 5 on the right side constitute the source leads 5a. The two source leads 5a is provided in continuous with one side of one connecting portion 30 as described above. The connecting portion 20 extends in parallel with the outer frame 41. The length thereof as viewed in its extending direction is 5.4 mm and the length thereof, i.e., the width thereof as viewed in its orthogonal direction is 1.36 mm.

Further, the leads 5 are connected to one another by a tie bar 44 extending in parallel with the outer frame 41.

On the other hand, each suspender lead 4 protrudes from the tie bar 44 placed between the gate lead 5b and the source lead 5a adjacent thereto. The suspender lead 4 is bent downward in one stepwise form in the course thereof, and has a leading end to which its corresponding header 3 having the above-described shape is connected. A step formed by its bending is set to 2.59 mm. Further, the adjacent headers 3 are connected to one another by a thin link-up portion 45. A mounting hole 21 is defined in each header 3 as described above.

The link-up portions 45, the outer frame 41 and the tie bar 44 can bring a unit lead frame into a multiple lead frame configuration. After the completion of molding at the manufacture, these link-up portions 45, outer frame 41 and tie bar 44 are cut off and removed.

Next, highly thermal conductive silver pastes 15 are applied to a square fixing area 7a provided on the header 3 of the lead frame 40 so as to scatter as highly thermal conductive adhesives as shown in FIG. 8 (Step 102). In association with FIG. 2, the highly thermal conductive silver pastes 15 are provided at five spots in total as a highly thermal conductive silver paste 15a located in the central portion of the fixing area 7a and four highly thermal conductive silver paste 15b provided therearound.

Next, a high bonding or junction strength silver paste 16 is applied to the fixing area 7a left around the highly thermal conductive silver paste 15 as a high bonding or junction strength adhesive (Step 103). At this time, the occurrence of air gaps is avoided in such a manner that no air enters an interface surface between the highly thermal conductive silver pastes 15 and the high junction strength silver paste 16. Thus, the bonding material 13 is applied onto the whole fixing area 7a.

As the highly thermal conductive silver pastes 15, such an adhesive as disclosed in U.S. Pat. No. 5,391,604, for example is used. As the high junction strength silver paste 16, such an adhesive as disclosed in Japanese Patent Application Laid-Open No. 60(1985)-170658 is used.

Figure 9:
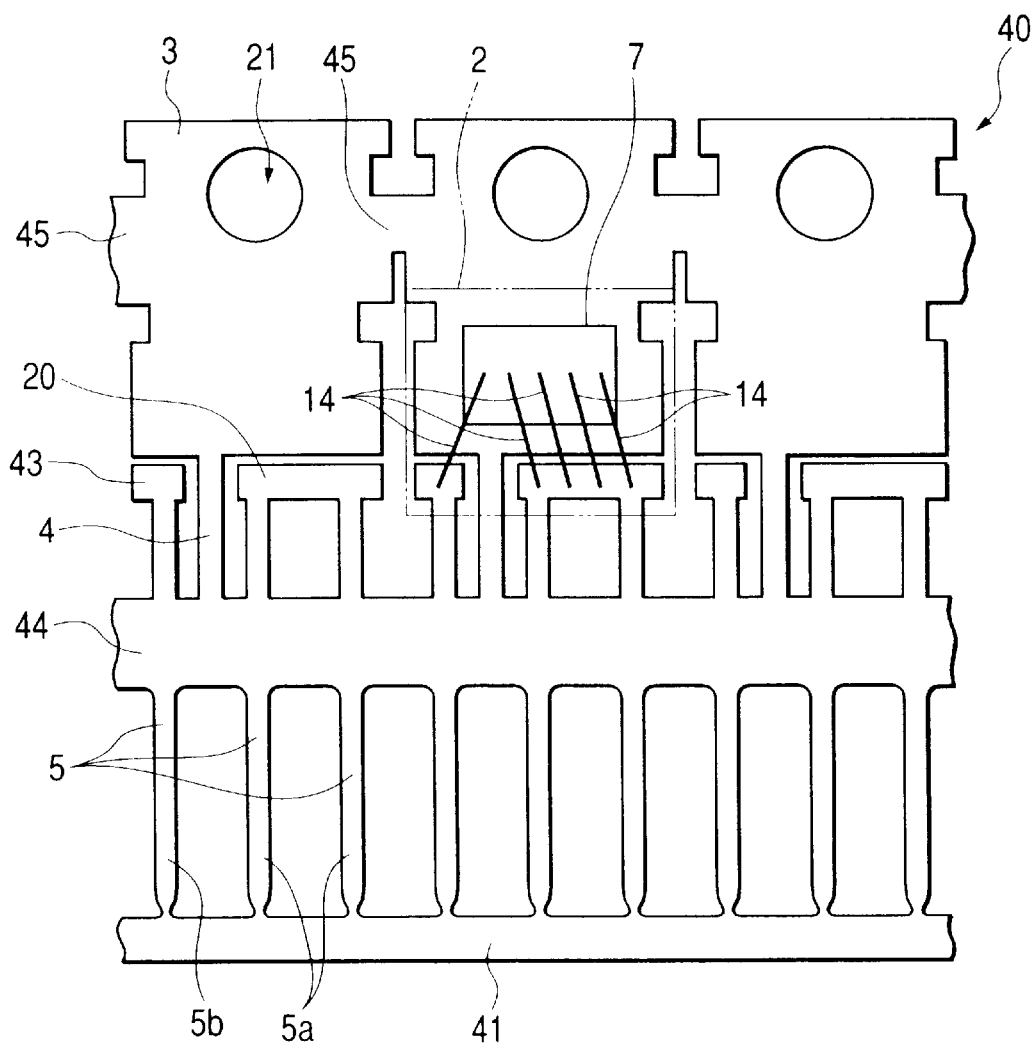
FIG. 9 is a plan view depicting the lead frame having fixed the semiconductor chip thereto.

Next, the semiconductor chip 7 is fixed as indicated on the fixing area provided on the header 3 as shown in FIG. 9. This fixing is executed by positioning the semiconductor chip 7 on the bonding material 13, placing it thereon, applying a predetermined load thereto so as to press against the header 3, discharging air lying between the semiconductor chip 7 and the bonding material 13 to the outside (Step 104), and thereafter curing (baking) the bonding material 13 (Step 105).

Next, electrodes placed on the upper surface of the semiconductor chip 7 and their corresponding leads are connected to one another by wires 14 (Step 106). Namely, a gate electrode 12 and its corresponding wire pad 43 of each gate lead 5b are connected to each other by the wire 14 (ultrasonic wire bonding). Since the wire 14 is low in current amount at its application, it may be thin. It is an Al wire whose diameter is about 100 μm, for example. A source electrode 11 of the semiconductor chip 7 and the connecting portion 20 are connected to each other by the wires 14 based on the ultrasonic wire bonding. Upon this wire bonding, four Al wires whose diameters are respectively 500 μm, are bonded in parallel by parallel bonding or stitch bonding. The length of each wire set based on bonding ranges from 5.23 mm to 5.62 mm.

Next, molding is carried out through the use of a transfer mold or the like as indicated by a chain double-dashed line in FIG. 9 (Step 107). A portion extending from the leading end side of each cantilever-structured lead 5 to a portion located in the course of each header 3 is covered with a sealing body or material 2 comprised of an insulative resin. Since the sealing material 2 covers only the upper surface side of the header 3, the lower surface of the header 3 is exposed from the sealing material 2 and hence serves as a heat transfer surface for radiation.

Although not shown in the drawing, the cutting and shaping or molding of each lead are next done by a normal lead cutting/molding apparatus (Step 108). Upon lead cutting, the leads 5 are separated from the outer frame 41 and each suspender lead 4 is cut off in the neighborhood of the sealing material 2. The tie bar 44 is cut off and removed by a predetermined width. Further, the link-up portion 45 between the adjacent headers 3 is punched out in slit form to thereby separate the adjacent headers 3 from one another. Upon lead molding, the cutting for determining the sizes of the gate and source leads 5b and 5a is carried out, and the leads are shaped in gull-wing types. Thus, a semiconductor device (power transistor) 1 having a surface-mounted structure can be manufactured.

While the leads are of the surface-mounted structures in the present embodiment 1, a power transistor 1 having an insertion-mounted structure wherein each individual leads 5 extend straight from one end of each sealing material 2, can be manufactured if no lead molding is carried out and the lead sizes are defined in the lead cutting process step.

According to the present embodiment 1, the following advantageous effects are obtained.

(1) The heat generated by the semiconductor chip 7 can be transferred to the header 3 and heat-dissipated highly efficiently by the highly thermal conductive silver pastes 15. Further, the semiconductor chip can firmly be fixed to the support plate by the high junction strength adhesive 16. As a result, stable heat dissipation can be carried out even in a temperature cycle test without an increase in thermal resistance. It is thus possible to improve a heat-dissipation property and an electrical characteristic and achieve a stable operation of a semiconductor device. Namely, compatibility between electrical/thermal high conductivity and high reliability with respect to environmental stresses such as a temperature cycle, etc. can be obtained.

(2) The highly thermal conductive adhesive 15 [conductive adhesive (2)] excellent in electrical/thermal conductivity is placed just below a heating portion (heating area) of the semiconductor chip 7 and a current-conducting path, whereby a conduction characteristic equivalent to the case of a metal property like solder using lead and tin is ensured. Further, an adhesive [conductive adhesive (1) or non-conductive adhesive] excellent in connection strength is placed in the remaining area on the back (fixed area) of the semiconductor chip 7, whereby degradation of developments in cracks of each connecting portion due to environmental stresses or the like, etc. can be controlled.

(3) Since the highly thermal conductive adhesives 15b are disposed in distributed form at the corners and peripheral portions of the semiconductor chip 7, a structure is used wherein a portion at which a stress caused by a thermal stress or the like is large, is effectively reinforced. Thus, the effect of ensuring a high junction strength and improving the life of a temperature cycle is obtained.

(4) The semiconductor chip 7 can firmly be fixed to the header 3 without having to use environmental harmful substances. Accordingly, a failure in the operation of the semiconductor chip 7, which is caused by the heat generated thereat, does not occur even in the power transistor 1 such as a TO220 type or the like, whereby a stable operation can be achieved.

Incidentally, since the electrical connections between the lower electrode of the semiconductor chip 7 and the header 3 can be achieved by use of the highly thermal conductive adhesives, an insulating adhesive may be used as the high junction strength adhesive to improve a junction strength. When the suspender lead 4 is caused to protrude from the sealing material 2 and is used as an external electrode terminal for a drain electrode, it is needless to say that the whole adhesive may be an insulative one.

Even if an adhesive containing a metal is used as a highly thermal conductive adhesive and a resin adhesive containing no metal is used as a high junction strength adhesive, an effect similar to the embodiment 1 can be obtained. Even if one containing silver is used as the highly thermal conductive adhesive and one containing no silver is used as the high junction strength adhesive, a effect similar to the embodiment 1 can be obtained.

(Embodiment 2)

FIG. 10 is a typical view showing a semiconductor device (power transistor) according to another embodiment (embodiment 2) of the present invention, wherein FIG. 10(a) is a cross-sectional view thereof and FIG. 10(b) is a typical view showing the state of placement of a bonding material 13 for bonding a support plate 3 and a semiconductor chip 7 to each other. The present embodiment 2 is a structure effective when the hygroscopic property of a highly thermal conductive silver paste to be used is sufficiently low and there is no fear of causing a reflow crack.

The present embodiment 2 has a structure wherein in the structure according to the embodiment 1, a highly thermal conductive adhesive 15c (15) is laid out in a central portion of a fixing area 7a on which the semiconductor chip 7 is placed, and a high junction strength adhesive 16 is disposed in its peripheral portion, as shown in FIGS. 10(a) and 10(b). The highly thermal conductive adhesive 15c has a shape slightly smaller than that of the semiconductor chip 7.

Since the highly thermal conductive adhesive 15c is widely provided in the central portion of the fixing area 7a, a current is efficiently carried through the highly thermal conductive adhesive 15c, and the head generated by the semiconductor chip 7 can rapidly be transferred to a header 3.

Since the area of the highly thermal conductive adhesive 15c is large as compared with the structure according to the embodiment 1, electrical/thermal conductivity results in a further excellent one.

(Embodiment 3)

FIG. 11 is a typical view showing a semiconductor device according to a further embodiment (embodiment 3) of the present invention. The present embodiment 3 is an example of a ball-grid array structure applied to a power IC, an LSI or the like.

A support plate 3 employed in the present embodiment 3 comprises a wiring substrate structure and has a plurality of projecting electrodes 5e provided on the back thereof in array form. A semiconductor chip 7 is fixed to the surface of the support plate 3 with a bonding material 13 interposed therebetween. In a manner similar to the embodiment 2, the bonding material 13 comprises a highly thermal conductive adhesive 15c large in diameter, which includes the center of a fixing area 7a, and a high junction strength adhesive 16 which surrounds the highly thermal conductive adhesive 15c and spreads over the remaining fixing area 7a.

Unillustrated electrodes provided on the surface of the semiconductor chip 7, and bonding pads used as parts of wirings, which are provided on the surface of the support plate 3, are electrically connected to one another by conductive wires 14. Further, a sealing body or material 2 formed of an insulative resin is provided over the surface of the support plate 3. The sealing material 2 covers the semiconductor chip 7 and the wires 14, etc.

The present embodiment 3 provides a structure effective where the heat is principally generated in the central portion of the semiconductor chip 7 or it is substantially uniformly generated in the whole semiconductor chip 7.

The semiconductor device 1 according to the present embodiment 3 has performance resistant to stresses such as a thermal stress, etc. as a result of the efficient transfer of heat generated by the semiconductor chip 7 to the support plate 3.

(Embodiment 4)

FIG. 12 is a typical view showing a semiconductor device according to a still further embodiment (embodiment 4) of the present invention. The present embodiment 4 shows a structure wherein in the semiconductor device 1 having the structure according to the embodiment 3, highly thermal conductive adhesives 15 are provided in distributed form, and a larger-diameter highly thermal conductive adhesive 15d is disposed so as to correspond to an area large in the amount of heat generated by the semiconductor chip 7.

Namely, the present embodiment is an example in which a larger-diameter highly thermal conductive adhesive 15d (15) is laid out in the neighborhood of the upper right corner of a fixing area 7a and is associated with a heated portion of the semiconductor chip 7, and smaller-diameter highly thermal conductive adhesives 15e (15) are placed in the upper left, lower left and lower right corners of the fixing area 7a.

The present embodiment 4 shows a structure applied to a structure or the like in which the heated portion of the semiconductor chip 7 deviates from the center.

According to the present embodiment 4, the heat generated from the semiconductor chip 7 is effectively transferred to a support plate 3 through the highly thermal conductive adhesive 15d. Since the highly thermal conductive adhesives 15e at the corners corresponding to other three points are low in junction strength, degradation due to stresses such as a thermal stress, etc. is developed from such portions. Therefore, the highly thermal conductive adhesive 15d placed to ensure heat radiation is effectively protected, and a stable operation of the semiconductor device 1 can be maintained.

(Embodiment 5)

Figure 14:
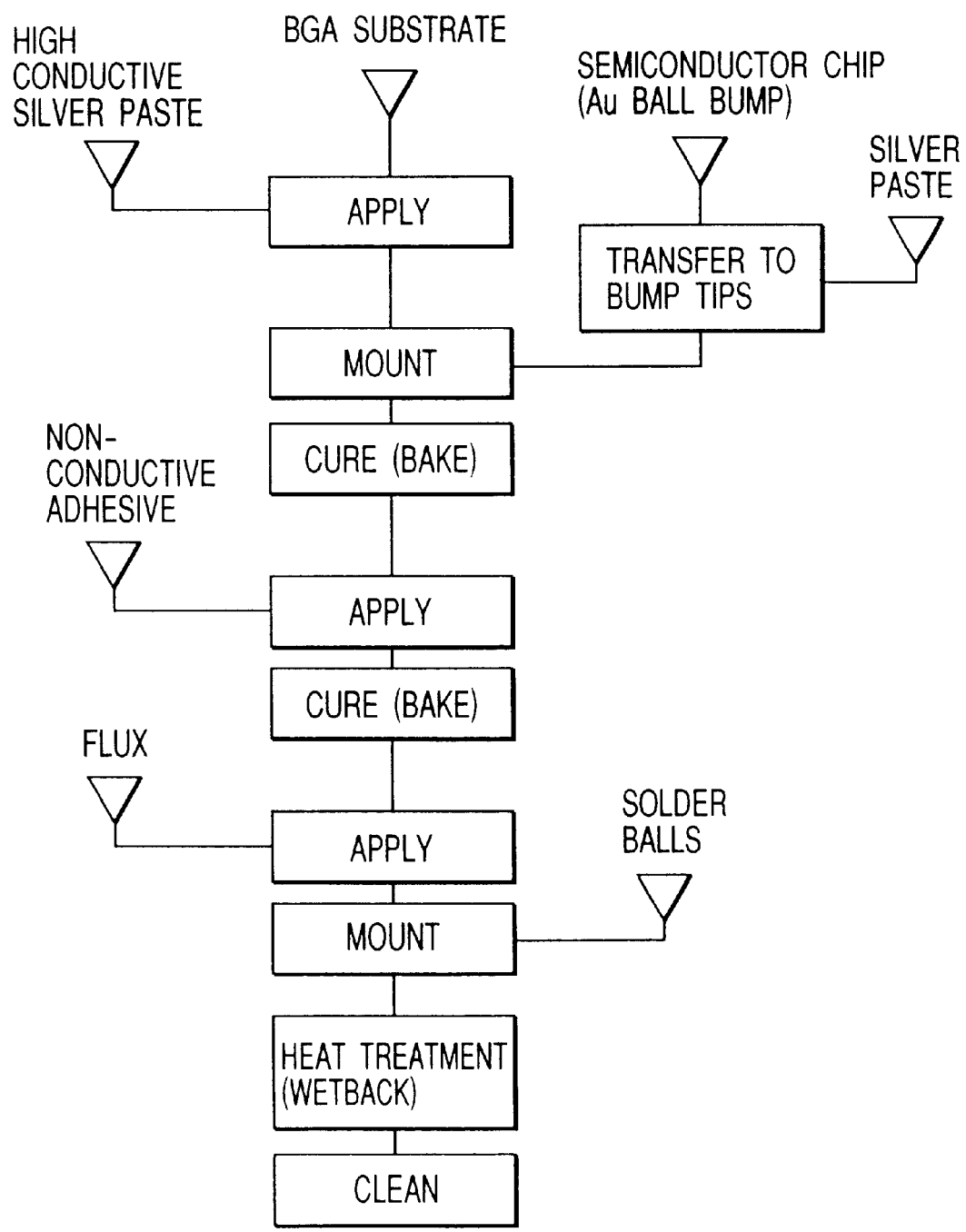
FIG. 14 is a flowchart showing a method of manufacturing the semiconductor device.

FIGS. 13 and 14 are respectively views related to a semiconductor device according to a still further embodiment (embodiment 5) of the present invention. FIG. 13 is a typical sectional view of the semiconductor device. The present embodiment 5 is an example of a ball grid array structure applied to a power IC, an LSI or the like in a manner similar to the embodiment 3.

A support plate 3 employed in the present embodiment 5 comprises a wiring substrate structure and has a plurality of projecting electrodes 5e provided on the back thereof in array form. A semiconductor chip 7 is fixed to the surface of the support plate 3 by face-down bonding. Protruding electrodes 9 are provided on the surface of the semiconductor chip 7. Further, the protruding electrodes 9 are electrically connected to their corresponding pads used as parts of unillustrated wirings on the surface of the support plate 3 so as to overlap one another. The semiconductor chip 7 and the support plate 3 are connected to each other by a bonding material 13. The bonding material 13 comprises a highly thermal conductive adhesive 15f (15).

The interval defined between the semiconductor chip 7 and the support plate 3 is charged with an insulative resin (underfill) 50.

The manufacture of the ball grid array type semiconductor device 1 will now be explained in brief with reference to the flowchart shown in FIG. 14. A BGA substrate, i.e., a support plate having a wiring substrate structure, and a semiconductor chip are first prepared. A high conductive silver paste is applied to a predetermined place of the support plate.

Next, the semiconductor chip is placed on the high conductive silver paste. Golden ball bumps are formed on the surface of the semiconductor chip in advance, and silver pastes are respectively transferred to the golden ball bumps.

The support plate with the semiconductor chip placed thereon is subjected to cure (bake) processing so that the semiconductor chip is fixed to the support plate.

Next, a non-conductive adhesive (insulative adhesive) is end-point applied between the semiconductor chip and the support plate. The present non-conductive adhesive (underfill) is subjected to the cure (bake) processing.

Next, flux is applied to pads on the back of the support plate, on which solder balls are to be placed. Next, the solder balls are mounted on the pads provided on the back of the support plate and heat-treated (wet-backed), whereby the solder balls are attached to the support plate.

Next, cleaning is done to wash out the flux, whereby the semiconductor device 1 is manufactured.

Even in the case of the present embodiment 5, a semiconductor device can be provided or offered which is good in heat radiation characteristic and electrical characteristic and is capable of achieving a stable operation in a manner similar to the respective embodiments.

(Embodiment 6)

Figure 15:
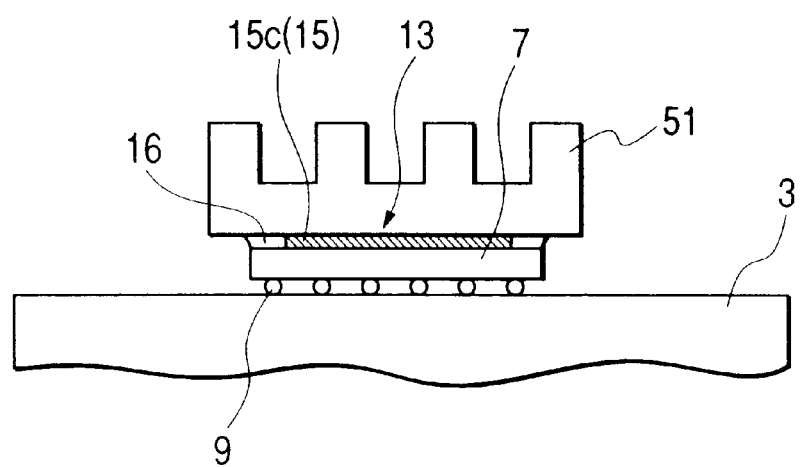
FIG. 15 is a typical cross-sectional view illustrating the state of mounting of a semiconductor device according to a still further embodiment (embodiment 6) of the present invention.
Figure 16:
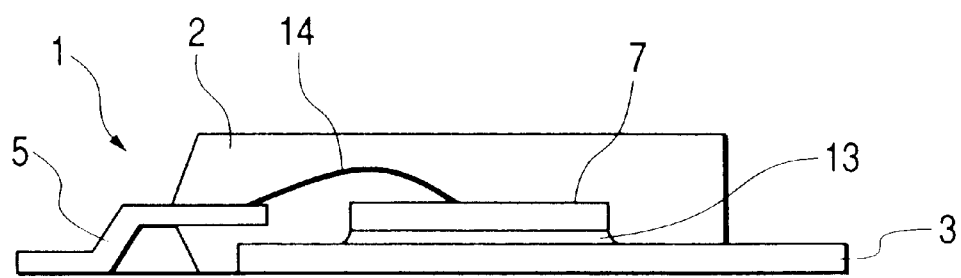
FIG. 16 is a typical cross-sectional view depicting a conventional semiconductor device.
Figure 17:
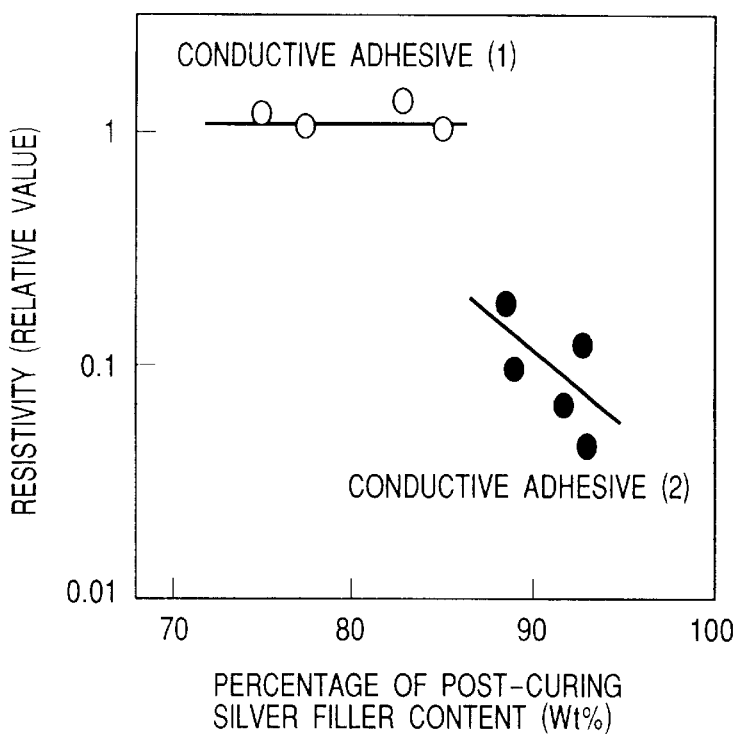
FIG. 17 is a graph showing the correlation between silver filler content in each of conventional conductive adhesives and resistivity thereof.
Figure 18:
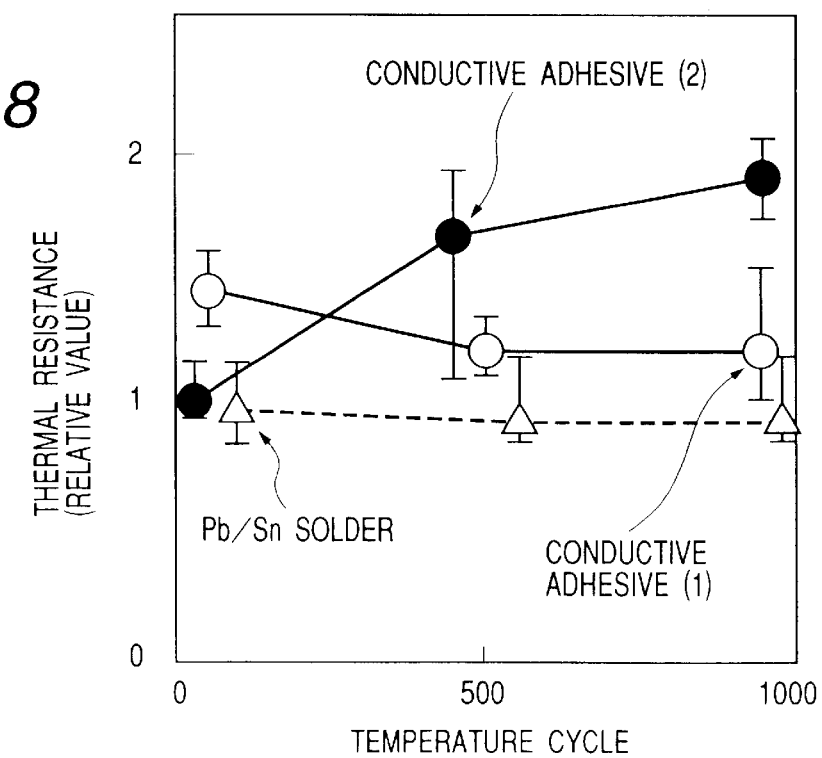
FIG. 18 is a graph showing the correlation between a temperature cycle for each conventional conductive adhesive and thermal resistance thereof.

FIG. 15 is a typical cross-sectional view showing the state of mounting of a semiconductor device according to a still further embodiment (embodiment 6) of the present invention. The present embodiment 6 provides a structure wherein in a power IC or an LSI or the like, a semiconductor chip 7 is fixed to the surface of a support plate 3 comprised of a wiring substrate by face-down bonding, and a radiating fin 51 is attached to the back of the semiconductor chip 7 for the purpose of radiation.

Protruding electrodes 9 of the semiconductor chip 7 are connected to their corresponding wiring portions of the support plate 3. The semiconductor chip 7 is fixed to the radiating fin 51 by a bonding material 13 comprised of a highly thermal conductive adhesive 15c (15) and a high junction strength adhesive 16.

Since the highly thermal conductive adhesive 15c is placed in the central portion of the back of the semiconductor chip 7 in the present embodiment 6, heat is effectively transferred to the radiating fin 51, thereby making it possible to achieve a stable operation of the semiconductor device 1.

Since the high junction strength adhesive 16 is disposed on the periphery of the semiconductor chip 7 on the fixed portion side thereof, the semiconductor chip 7 is protected from degradation due to stresses such as a thermal stress, etc.

While the invention made above by the present inventors has been described specifically by the embodiments, the present invention is not limited to the embodiments. It is needless to say that various changes can be made thereto within the scope not departing from the substance thereof. While the semiconductor chip to be mounted is set as single in the respective embodiments, for example, a structure wherein a plurality of semiconductor chips are mounted on a support plate, can be applied in a manner similar to the embodiments, and a similar effect is obtained.

Advantageous effects obtained by typical ones of the inventions disclosed in the present application will be described in brief as follows:

(1) A semiconductor device can be provided which brings about electrical/thermal high conductivity and is highly reliable with respect to environmental stresses such as a temperature cycle, etc.

(2) A semiconductor device can be provided which is highly reliable with respect to environmental stresses without having to use an environmental harmful substance (lead).

(3) A semiconductor device operated stably even with respect to heat generated upon the operation thereof, and a method of manufacturing it can be provided.

What is claimed is:

1. A semiconductor device comprising:
    a support plate which supports a semiconductor chip; and
    said semiconductor chip fixed onto said support plate with an adhesive interposed therebetween;
    wherein said semiconductor chip is fixed to said support plate by a first adhesive and a second adhesive provided so as to separate bonding areas from one another, and said first adhesive is a highly thermal conductive adhesive higher in thermal conductivity than said second adhesive and said second adhesive is a high junction strength adhesive higher in junction strength than said first adhesive; and
    wherein a space gap is absent at an interface between a peripheral edge of the highly thermal conductive adhesive and a bonded portion formed by the high junction strength adhesive.

2. The semiconductor device according to claim 1, wherein said highly thermal conductive adhesive is an adhesive containing a metal and said high junction strength adhesive is a resin adhesive containing no metal.

3. The semiconductor device according to claim 2, wherein said highly thermal conductive adhesive contains silver and said high junction strength adhesive contains no silver.

4. The semiconductor device according to claim 1, wherein an entirety of the fixing area of said semiconductor chip is fixed to said support plate by the highly thermal conductive adhesive and the high junction strength adhesive.

5. The semiconductor device according to claim 1, wherein said highly thermal conductive adhesive is provided in plural places within an entirety of the fixing area.

6. The semiconductor device according to claim 1, wherein said highly thermal conductive adhesive is placed so as to correspond to a heated portion of said semiconductor chip.

7. The semiconductor device according to claim 1, wherein said highly thermal conductive adhesive comprises a conductive adhesive, and said high junction strength adhesive comprises a conductive adhesive or a non-conductive adhesive.

8. The semiconductor device according to claim 1, wherein said highly thermal conductive adhesive and said high junction strength adhesive contain no lead.

9. The semiconductor device according to claim 1, wherein a plurality of semiconductor chips are fixed to said support plate.

10. The semiconductor device according to claim 1, wherein said support plate comprises a wiring substrate provided with a plurality of external electrode terminals on the back thereof, and said semiconductor chip is fixed to the surface of said wiring substrate.

11. The semiconductor device comprising:
    a support plate which supports a semiconductor chip; and
    said semiconductor chip fixed onto said support plate with an adhesive interposed therebetween;
    wherein said semiconductor chip is fixed to said support plate by a first adhesive and a second adhesive provided so as to separate bonding areas from one another, and said first adhesive is a highly thermal conductive adhesive higher in thermal conductivity than said second adhesive and said second adhesive is a high junction strength adhesive higher in junction strength than said first adhesive;
    wherein a space gap is absent at an interface between a peripheral edge of the highly thermal conductive adhesive and a bonded portion formed by the high junction strength adhesive; and
    wherein said support plate comprises a radiating fin, said semiconductor chip is fixed to the surface of said radiating fin, and a plurality of external electrode terminals are provided on the surface of said semiconductor chip.

12. A semiconductor device comprising:
    a sealing body comprised of an insulative resin;
    a metal support plate which has at least part covered with said sealing body, and a lower surface exposed from said sealing body and which serves as a first electrode;
    a suspender lead which is continuously connected to said support plate and protrudes from one side of said sealing body;
    a second electrode lead which serves as a second electrode, and a control electrode lead which serves as a control electrode, both of which protrude from said one side of said sealing body side by side; and
    a semiconductor chip which is covered with said sealing body, has a first electrode at a lower surface thereof, and has a second electrode and a control electrode at an upper surface thereof and whose lower surface is fixed to said support plate with a conductive adhesive interposed therebetween; and
    wires which are placed within said sealing body and respectively electrically connect the second electrode with the second electrode lead, and the control electrode with the control electrode lead,
    wherein said semiconductor chip has a whole fixing area fixed to said support plate by a highly thermal conductive adhesive and a high junction strength adhesive provided so as to separate bonding areas from one another, and a space gap is absent at an interface between a peripheral edge of the highly thermal conductive adhesive and a bonded portion formed by the high junction strength adhesive.

13. The semiconductor device according to claim 12, wherein said highly thermal conductive adhesive is provided in plural places within the whole fixing area, and said partial highly thermal conductive adhesive is placed so as to correspond to a heated portion of said semiconductor chip.

14. The semiconductor device according to claim 12, wherein said highly thermal conductive adhesive and said high junction strength adhesive contain no lead.

15. The semiconductor device according to claim 12, wherein the control electrode lead and the second electrode lead, which protrude from the one side of said sealing body, are respectively bent in the course thereof so as to take surface-mounted structures.

16. The semiconductor device according to claim 12, wherein a mounting hole is formed in a portion which protrudes from said sealing body of said support plate.

17. The semiconductor device according to claim 12, wherein said semiconductor chip has any of a power MOSFET, a power bipolar transistor and an IGBT wherein the first electrode, second electrode and control electrode are respectively set as electrodes.

* * * * *